United States Patent
Su et al.

(10) Patent No.: US 7,896,689 B1
(45) Date of Patent: Mar. 1, 2011

(54) ELECTRICAL CABLE CONNECTOR ASSEMBLY WITH IMPROVED WIRE ORGANIZER

(75) Inventors: Ping-Sheng Su, Tu-Cheng (TW); Fan-Bo Meng, Kunshan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/858,790

(22) Filed: Aug. 18, 2010

(30) Foreign Application Priority Data

Aug. 18, 2009 (CN) .......................... 2009 2 0308164

(51) Int. Cl.
*H01R 12/24* (2006.01)

(52) U.S. Cl. ........................................ 439/497; 439/579

(58) Field of Classification Search ............ 439/497, 439/579, 942, 607.47, 607.56
See application file for complete search history.

(56) References Cited

U.S. PATENT DOCUMENTS 6,837,741 B2 * 1/2005 Kuwahara .................. 439/497
6,984,150 B2 * 1/2006 Kondou et al. ............. 439/606
7,267,575 B1 * 9/2007 Hwang ....................... 439/497
7,803,010 B1 * 9/2010 Hwang ....................... 439/497

* cited by examiner

*Primary Examiner*—Tho D Ta
(74) *Attorney, Agent, or Firm*—Wei Te Chung; Andrew C. Cheng; Ming Chieh Chang (57) ABSTRACT

An electrical cable connector assembly includes a printed circuit board, a wire organizer comprising a body portion defining a plurality of through holes and a retention slot recessed from an outer surface thereof, and a cable including a plurality of wires protruding through the through holes of the wire organizer for being soldered to the corresponding conductive pads of the printed circuit board, respectively. The printed circuit board has an outer side edge, and a plurality of conductive pads arranged at opposite front and rear ends thereof. The wires The outer side edge of the printed circuit board is retained into the retention slot of the wire organizer for preventing the printed circuit board from moving relative to the wires.

13 Claims, 7 Drawing Sheets

ELECTRICAL CABLE CONNECTOR ASSEMBLY WITH IMPROVED WIRE ORGANIZER

BACKGROUND OF THE INVENTION

1. Field of the Invention

The present invention generally relates to an electrical cable connector assembly, and more particularly to an electrical cable connector assembly with improved wire organizer.

2. Description of Related Art

With the development of communication and computer technology et al., electrical cable connector assembly for high-speed signal transmission is widely used in electronic systems. An electrical cable connector assembly is a kind of high-speed signal transmission connector which comprises a printed circuit board with a plurality of conductive pads arranged at opposite front and rear ends thereof, a wire organizer defining a plurality of through holes, and a plurality of wires protruding through the through holes of the wire organizer. Each wire includes a plurality of conductors respectively soldered with the conductor pads of the printed circuit board. However, when the electrical cable connector assembly is being assembled, the conductive pads of printed circuit board may be broken away from the conductor of the wires while the wire organizer and the wires moving with the printed circuit board together. Thus, a junction between the conductors of the wires and the pads of the printed circuit board may be destroyed.

Correspondingly, it is desired to have an electrical cable connector assembly with improved structure to address the problems stated above.

BRIEF SUMMARY OF THE INVENTION

According to one aspect of the present invention, an electrical cable connector assembly comprises a printed circuit board having an outer side edge, and a plurality of conductive pads arranged at opposite front and rear ends thereof. A wire organizer comprises a body portion defining a plurality of through holes and a retention slot recessed from an outer surface thereof. A cable including a plurality of wires protruding through the through holes of the wire organizer for being soldered to the corresponding conductive pads of the printed circuit board, respectively. Wherein the outer side edge of the printed circuit board is retained into the retention slot of the wire organizer for preventing the printed circuit board from moving relative to the wires.

According to one aspect of the present invention, an electrical cable connector assembly comprises a housing defining a receiving room therein. A printed circuit board is retained in the receiving room and includes a front end with a plurality of first conductive pads protruding out of the housing for mating a complementary connector, a rear end having a plurality of second conductive pads. A wire organizer is located in the receiving room and includes a body portion defining a plurality of through holes passing therethrough, and a pair of retention arms extending forward from the body portion. The pair of retention arms are spaced from each other in a vertical direction. A cable includes a plurality of wires including a plurality of wires passing through the through holes of wire organizer. The wires are soldered to the second conductive pads of the printed circuit board respectively. Wherein the rear end of the print circuit board is sandwiched between the pair of retention arms for preventing the printed circuit board from moving relative to the wires.

Other objects, advantages and novel features of the invention will become more apparent from the following detailed description of the present embodiment when taken in conjunction with the accompanying drawings.

DETAILED DESCRIPTION OF THE INVENTION

Reference will now be made to the drawing figures to describe the present invention in detail.

Please refer to FIGS. 1-7, an electrical cable connector assembly 100 in accordance with the preferred embodiment of the present invention, comprises a die cast housing 1, a metal latching mechanism assembled to the housing 1, a printed circuit board (PCB) 3, a cable 6 including a plurality of the wires 60 soldered on the PCB 3, a wire organizer 4 aligning with the wires 60, an inner mold 5, The latching mechanism 2 includes a pair of latches 2 disposed at two sides of the housing 1. The inner mold 5 is molded on the PCB 3, the wires 60 and the wire organizer 4.

The housing 1 includes an top cover 11 and a lower cover 12 assembled with each other by two pairs of metal screws 9 in a vertical direction. Both of the top cover 11 and the lower cover 12 are die-cast to provide EMI protection. The housing 1 defines a receiving room 10 for receiving the PCB 3, the wire organizer 4, the inner mold 5 and a front portion of the cable 6 therein. The housing 1 defines a front opening 101, a rear opening 102 respectively formed on a front and a rear surface thereof, and a circle hole 103 communicated to a rear end of the rear opening 102. The front and rear opening 101, 102 respectively communicates with the receiving room 10 so as to allow the receiving room 10 communicating with an exterior.

Figure 1:
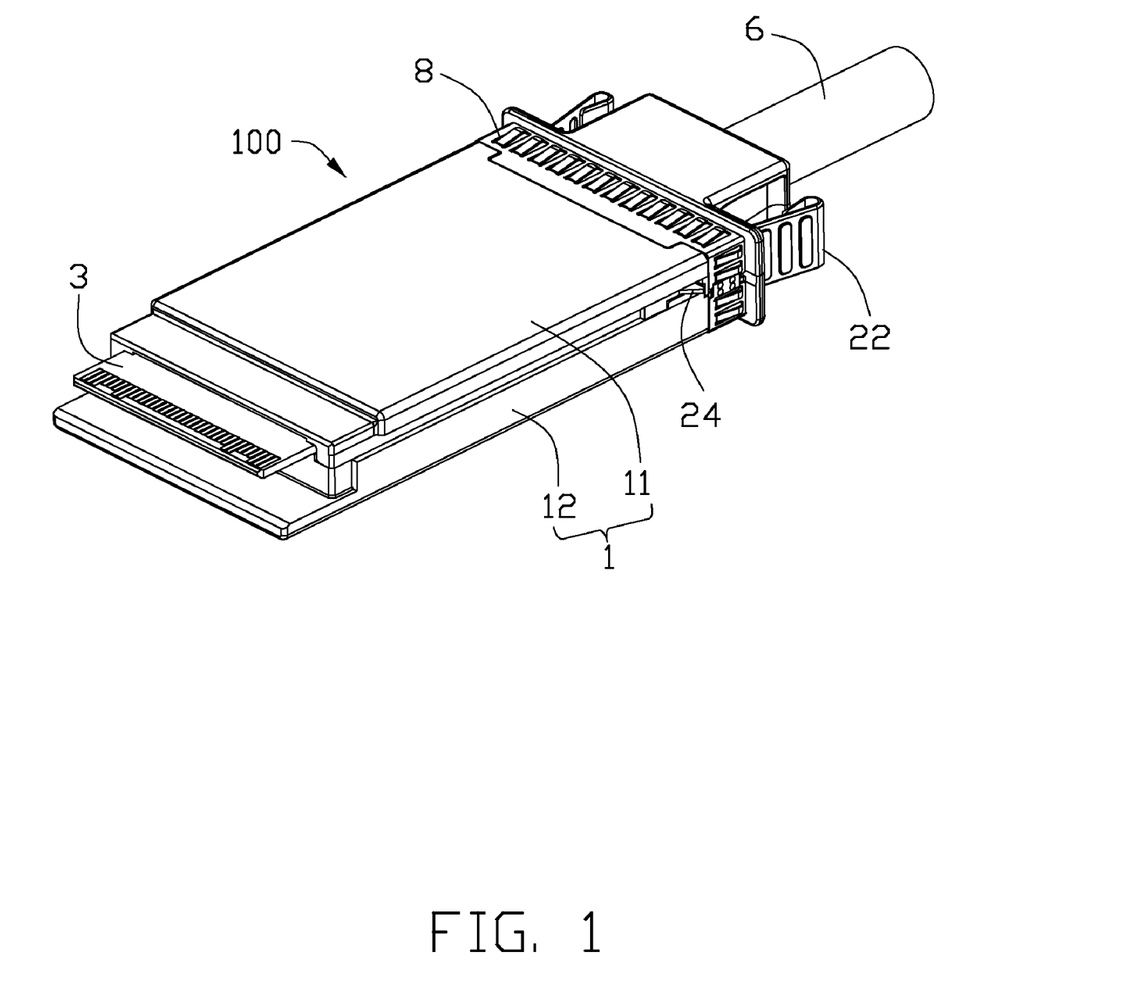
FIG. 1 is a perspective view of an electrical cable connector assembly in accordance with the preferred embodiment of the present invention.
Figure 2:
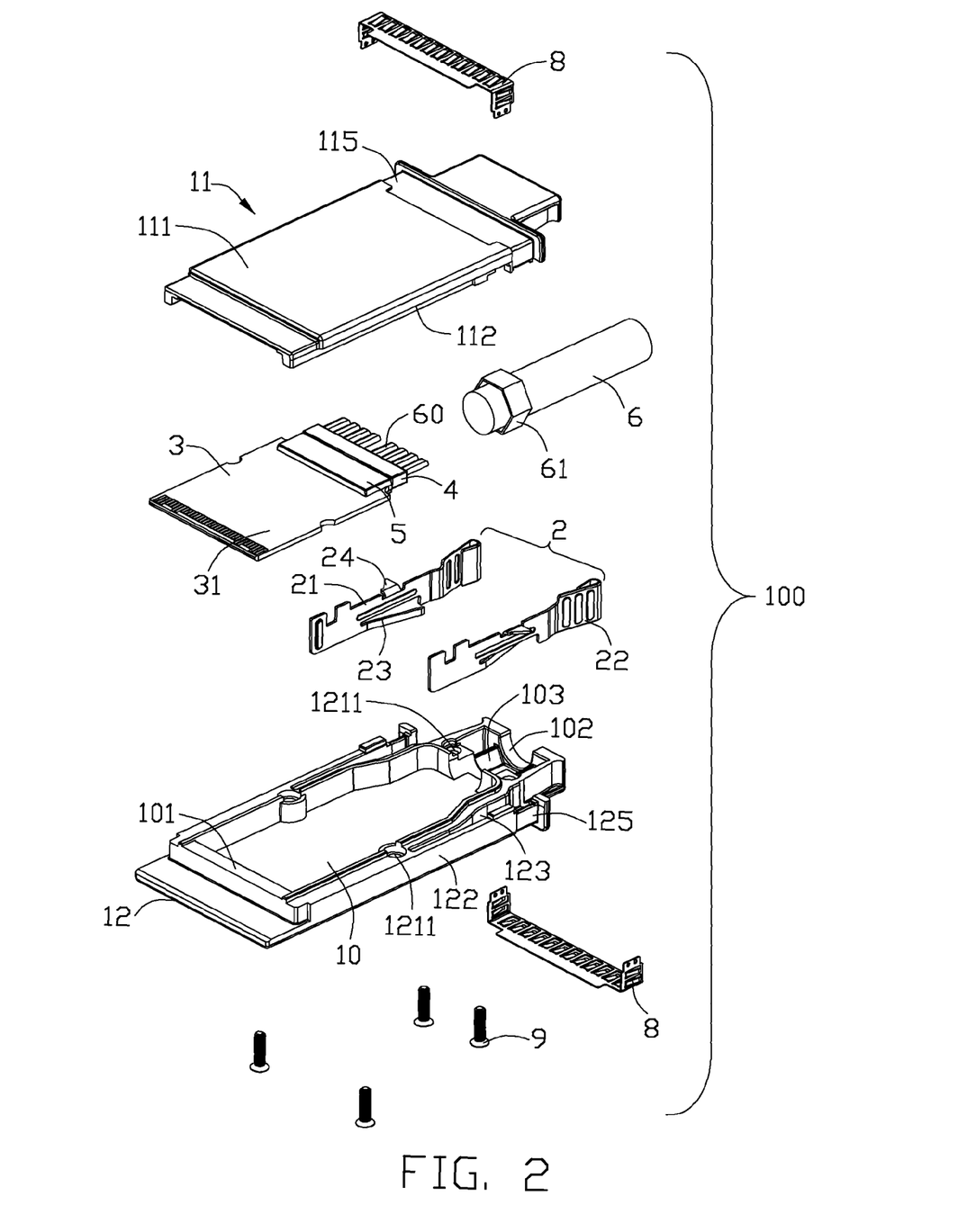
FIG. 2 is a partly exploded view of the electrical cable connector assembly shown in FIG. 1.
Figure 3:
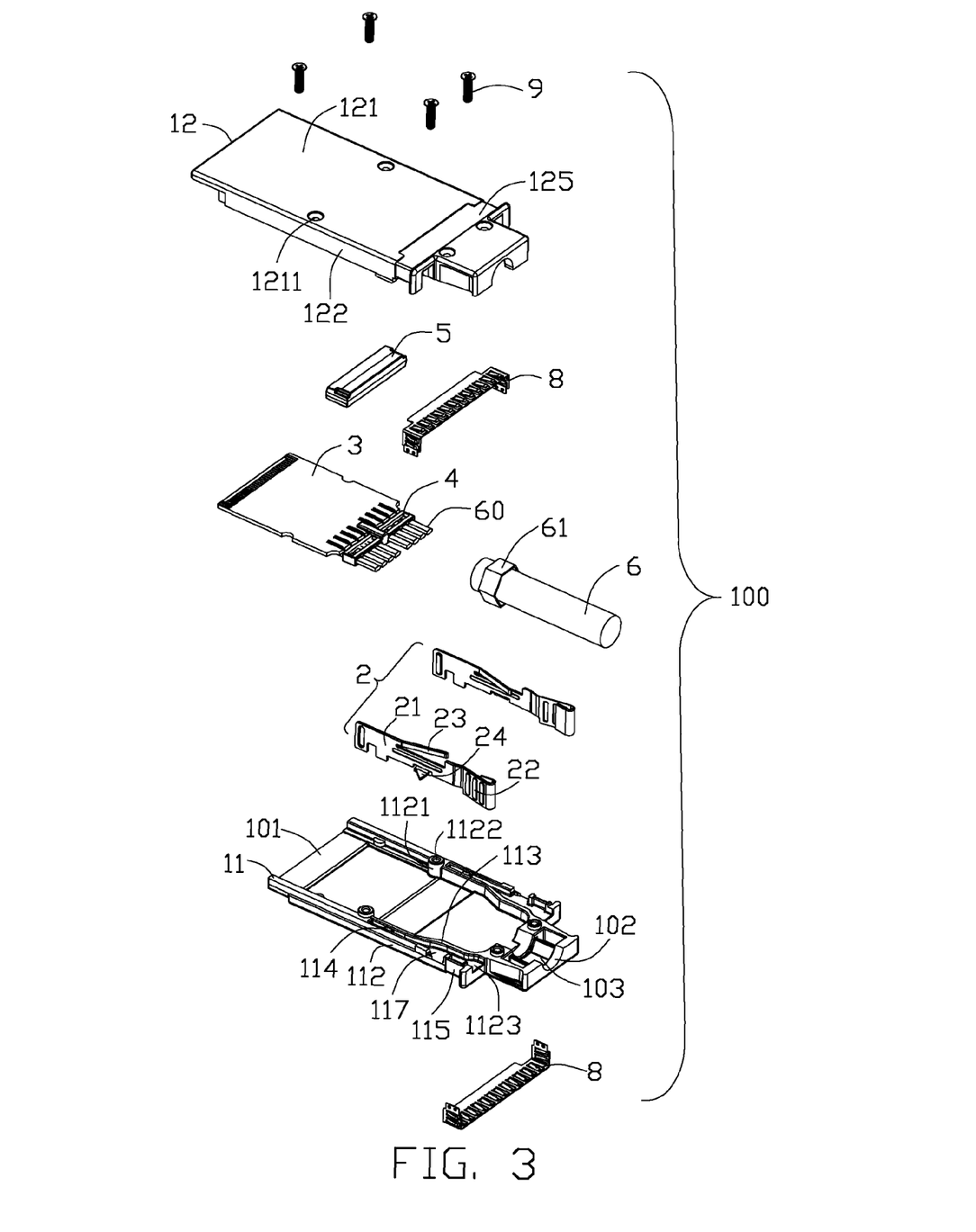
FIG. 3 is a view similar to FIG. 2, but viewed from a different aspect.
Figure 4:
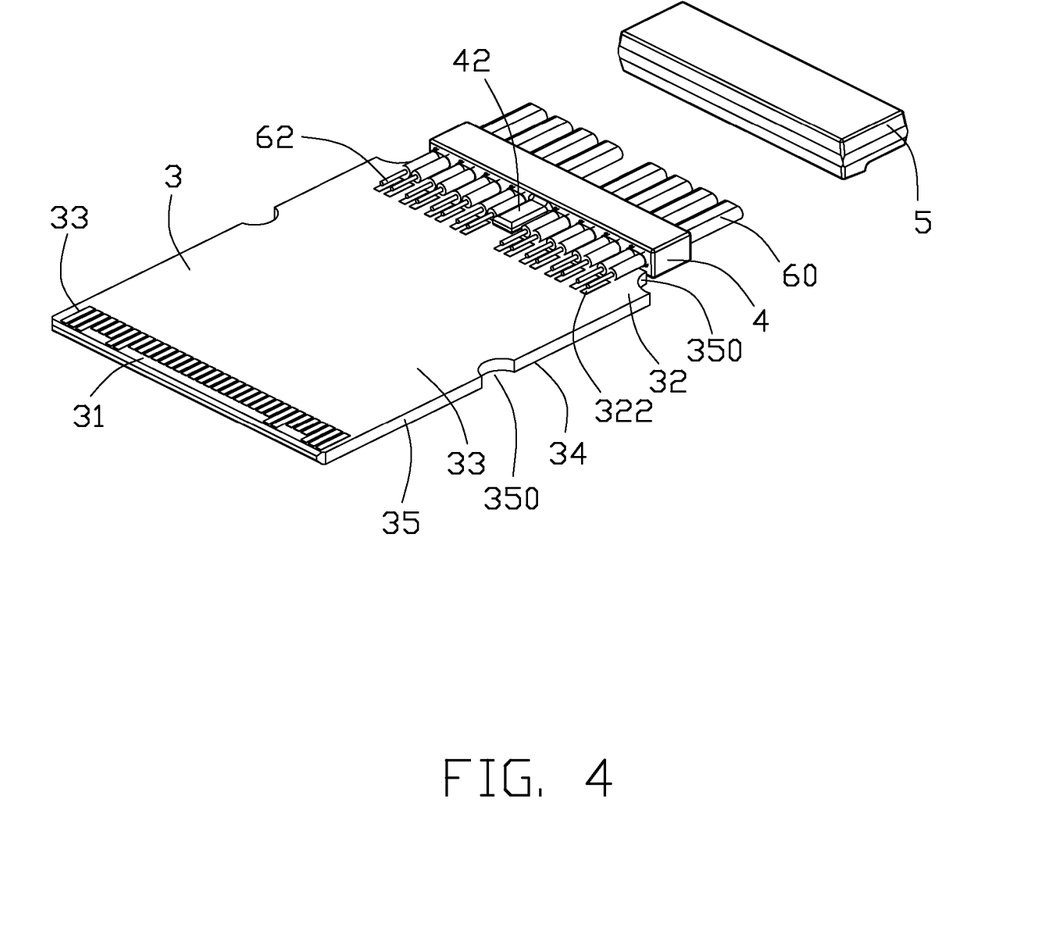
FIG. 4 is an assembled view of a printed circuit board cooperating with a plurality of wires of a cable and a wire organizer of the electrical cable connector assembly shown in FIG. 1.
Figure 5:
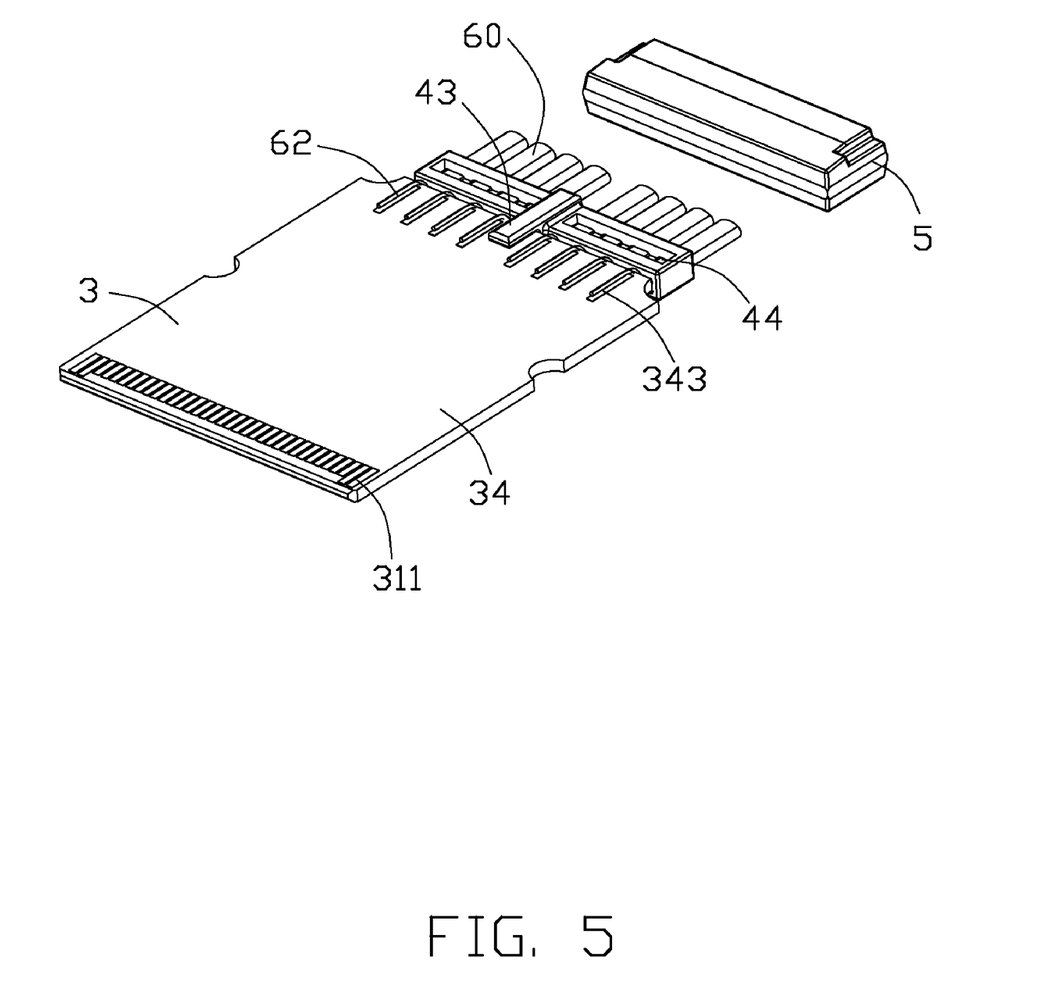
FIG. 5 is a view similar to FIG. 4, but viewed from a different aspect.
Figure 6:
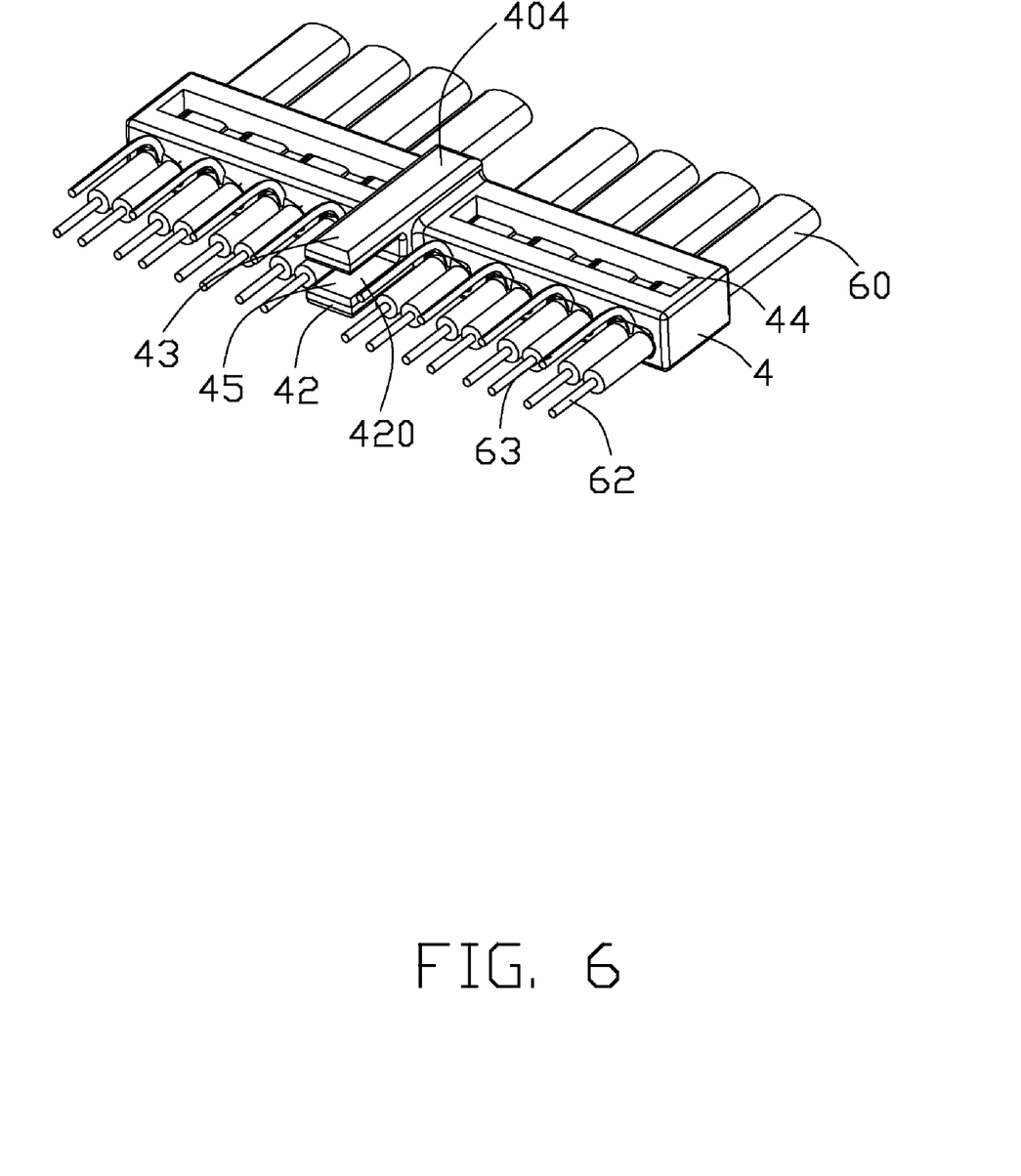
FIG. 6 is an assemble view of the wires cooperating with the wire organizer.
Figure 7:
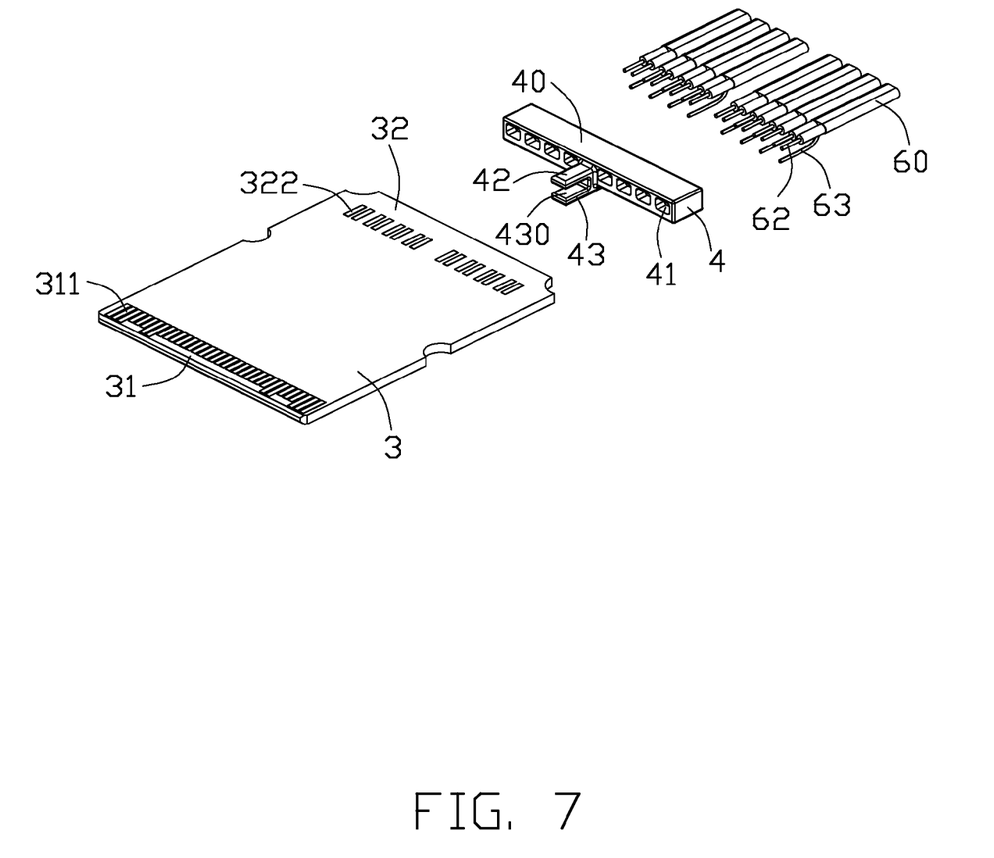
FIG. 7 an exploded view of the printed circuit board, the wires and the organizer being disposed apart away from each other.

Referring to FIGS. 2 to 4, the top cover 11 includes a top wall 111, a pair of first side walls 112 extending downwardly from two sides of the top wall 111, and a pair of first inclined ribs 113 extending downwardly from a bottom surface of the top wall 111. Each first side wall 112 defines a cutout 117 disposed at a rear end thereof. The pair of first ribs 113 are disposed between the first side walls 112. The pair of first ribs 113 are gradually closed with each other from front ends to rear ends. Each first rib 113 is angled with the first side wall 112 to form a trigonal receiving slot 114 in communication with the cutout 117. A first retangular groove 115 is formed on outer surfaces of rear ends of both of the top wall 111 and the first side walls 112. Thus, each first side wall 112 defines a pair of positioning posts 1121 and a depression 1123 recessed from a bottom surface of the rear end thereof. The first ribs 113 are respectively disposed between the pair of posts 1121 along a front-to-rear direction. Each positioning post 1121 defines a screw hole 1122.

The lower cover 12 includes a bottom wall 121 opposited to the top wall 111 of the top cover 11, a pair of second side walls 122 extending upwardly from two sides of the bottom wall 121, and a pair of second inclined ribs 123 extending upwardly from a top surface of the bottom wall 121 and corresponding to the pair of first ribs 113 of the lower cover 11 in the vertical direction. The second side walls 122 are respectively corresponded to the first side walls 112 of the lower cover 11 in the vertical direction. A second retangular groove 125 is formed on outer surfaces of a rear end of both of the bottom wall 121 and the second side walls 122 and corresponded to the first groove 115 of the top cover 11. A pair of U-shaped metal bending plates 8 received in the grooves 115, 125. The pair of bending plates 8 are retained with each other to securely fasten the top cover 11 and the lower cover 12 together in the vertical direction. Two pairs of through holes 1211 are formed on the second side walls 122 of the lower cover 12 and corresponding to the screw holes 1122 in the vertical direction. The screws 9 pass upwardly through the through holes 1211 of the lower cover 12 and are screwed into the screw holes 1122 of the top cover 11 respectively to securely fasten the lower cover 12 and the top cover 11 together.

The latching mechanism includes a pair of latches 2 respectively located at two sides of the housing 1. Each latch 2 is stamped and formed from a metallic plate and comprises a base portion 21, a pressing portion 22 extending outwardly and rearwardly from a rear end of the base portion 21, an inclined elastic portion 23 teared inwardly and rearwardly from an upper edge thereof, and a cuniform latching tab 24 bending outwardly from a lower edge thereof. The base portion 21 of each latch 2 is received into the receiving slot 114. The elastic portion 23 resists to the first rib 113 and angled with the first rib 113. The latching tab 24 extends laterally to an exterior through the cutout 117 of the first side wall 112 for latching with a complementary connector (not shown). The pressing portion 22 extends rearwardly through the depression 1123 to the exterior for operator to release.

The PCB 3 is a flat board and comprises opposite front and rear ends 31, 32 and opposite upper and lower surfaces 33, 34. A plurality of first conductive pads 311 are formed at the front end 31 of the upper and lower surfaces 33, 34. A plurality of second conductive pads 322 are formed at the rear end 32 of the upper surface 33. The second conductive pads 322 are separated in several pairs along a laterally direction perpendicular to the front-to-rear direction of the electrical cable connector assembly 100. A plurality of third conductive pads 343 are formed at the rear end 34 of the lower surface 34. The PCB 3 further comprises two opposite side edges 35, and two pair of notches 350 formed on the side edges 35 and corresponding to the screws 9. One pair of notches 350 are formed at the rear end 32 of the PCB 3. Whereby the PCB 3 is retained by the screw 9 in both the laterally direction and the front-to-rear direction. The PCB 3 is sandwiched between the top cover 11 and the lower cover 12 in the vertical direction for preventing the PCB 3 from moving in the vertical direction. The front end 31 protrudes forwardly beyond the front opening 101 and is adapted for mating the complementary connector. The first conductive pads 311 may directly electrically connect with terminals of the complementary connector.

The wire organizer 4 is made from insulative material and present as a rectangular shape. The wire organizer 4 defines a body portion 40, and a row of elliptic-shape through holes 41 passing through the body portion 40, two opposite retention arms 42, 43 protruding forwardly from a middle portion 404 of the body portion 40, and a pair of openings 44 respectively recessed downwardly from an upper surface of the body portion 40 and respectively in communication with the through holes 41. The inner periphery of each through hole 41 is same as outer periphery of each wire 60. The retention arms 42, 43 include an upper retention arm 42, and a lower retention arm 43 disposed under the upper retention arm 42 to form a retention slot 45 therebetween. The retention arms 42, 43 are positioned between two adjacent through holes 41. A distance between the retention arms 42, 42 is substantially equal to a thickness of the rear end 32 of the PCB 3. The rear end 3 of the PCB 3 is sandwiched between the retention arms 42, 43 to prevent the PCB 3 from moving along an upper-to-lower direction. The retention arms 42, 43 each defines a level surface 420, 430 abutting against a dielectric area between adjacent two second and third conductive pads 322, 343 of the PCB 3. The middle portion 404 of the wire organizer 4 is thicker than other portions of the wire organizer 4 to ensure structure strength of the retention arms 42, 43 to clamp the PCB 3 firmly.

The cable 6 includes a plurality of wires 60 and a cable collar 61 that secures the cable 6 to the housing 1. The cable collar 61 retained in circle hole 103 for preventing the cable 6 from moving rearwardly. The cable 6 passes through the rear opening 102 to the exterior. Each wire 60 comprises a pair of signal conductors 62 respectively transmitting positive and negative signals, and a grounding conductor 63 soldered to the third conductive pad 343 of the lower surface 34. The signal conductors 62 are respectively soldered to the second conductive pads 322 of the PCB 3. The inner mold 5 is molded with PCB 3 to hold the wires 60 together with the conductive pads 322, 343 and the wire organizer 4 reliably.

When the electrical cable connector assembly 100 is in assembly, the PCB 3 needs to be moved together with the conductors 62, 63, The conductive pads 322, 343 would not apart away from the wires 60 via the PCB 3 sandwiched between the upper retention arm 42 and the lower retention arm 43.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical cable connector assembly, comprising: a printed circuit board having an outer side edge, and a plurality of conductive pads arranged at opposite front and rear ends thereof;

a wire organizer comprising a body portion defining a plurality of through holes and a retention slot recessed from an outer surface thereof; and a cable including a plurality of wires protruding through the through holes of the wire organizer for being soldered to the corresponding conductive pads of the printed circuit board, respectively;

wherein the outer side edge of the printed circuit board is retained into the retention slot of the wire organizer for preventing the printed circuit board from moving relative to the wires;

wherein the wire organizer includes an upper retention arm, and a lower retention arm disposed under the upper retention, the retention slot is formed between the upper retention arm and the lower retention arm, the upper retention arm and the lower retention arm each defines an inner level surface abutting against the printed circuit board along a vertical direction for preventing the printed circuit board from moving in the vertical direction;

wherein the upper retention arm and the lower retention arm extend forwardly from a middle portion of the body portion of the wire organizer and are located between two adjacent through holes of the wire organizer in a laterally direction.

2. The electrical cable connector assembly as claimed in claim 1, wherein the wire organizer has a distance between the upper retention arm and the lower retention arm, the distance is substantially equal to a thickness of the outer side edge of the printed circuit board.

3. The electrical cable connector assembly as claimed in claim 1, wherein the upper retention arm and lower retention arm extend forwardly from a middle portion of the wire organizer, the middle portion is thicker than the other portions of the wire organizer to ensure structure strength of the retention arms for clamping the printed circuit board firmly.

4. The electrical cable connector assembly as claimed in claim 1, wherein the body portion defines a pair of openings respectively recessed downwardly from an upper surface thereof and respectively in communication with the through holes, the middle portion is disposed between the pair of openings, an inner mold is molded with printed circuit board, the signal conductor and the wire organizer to hold the signal conductors together with the conductive pad and the wire organizer reliably.

5. The electrical cable connector assembly as claimed in claim 1, wherein the printed circuit board includes opposite front and rear ends, and opposite upper and lower surfaces, a plurality of first conductive pads are formed at the front end of the upper and lower surfaces, a plurality of second conductive pads are formed at the rear end of the upper surface, a plurality of third conductive pads are formed at the rear end of the lower surface, the wires each has a pair of signal conductors respectively soldered to the second conductive pads, and a grounding conductor soldered to the third conductive pad, the outer side edge is formed on at the rear end of the printed circuit board, the upper retention arm and the lower retention arm respectively abuts against a dielectric area between two adjacent conductive pads.

6. The electrical cable connector assembly as claimed in claim 5, further comprises a metallic housing including a top cover, a lower cover assembled to the top cover in the vertical direction, and a receiving room therein, the printed circuit board and the wire organizer are retained in the receiving room, the front end with the first conductive pads protrude forwardly beyond the top cover and the lower cover for mating a complementary connector.

7. The electrical cable connector assembly as claimed in claim 6, wherein the top cover includes a top wall, and a pair of first side walls extending downwardly from two sides of the top wall, the first side walls each defines a plurality of positioning posts each having a screw hole, the lower cover includes a bottom wall opposite to the top wall having a plurality of through holes corresponding to the screw holes of the top wall, and a pair of second side walls cooperating with the pair of first side walls, a plurality of metal screws respectively passes upwardly through the through holes of the bottom wall and is screwed into the screw holes to securely fasten the lower cover and the top cover together.

8. The electrical cable connector assembly as claimed in claim 7, wherein the printed circuit board is sandwiched between the first side walls and the second side walls in the vertical direction, the printed circuit board defines a plurality of notches formed on the side edges and engaging with to the screws for preventing the printed circuit board from moving both in the laterally direction and the front-to-rear direction.

9. The electrical cable connector assembly as claimed in claim 7, wherein the top cover includes a pair of ribs respectively spaced inwardly from the side walls thereof to form a receiving slot therebetween, the side walls each defines a cutout passing therethrough and in communication with the receiving slot, the electrical cable connector assembly further comprises a pair of latches respectively received into corresponding receiving slot, each latch has a base portion received into the receiving slot, a pressing portion extending outwardly and rearwardly from a rear end of the base portion and disposed out of the housing, the base portion defines an inclined elastic portion teared inwardly from an upper edge thereof and resist to the rib, and a cuniform latching tab bending outwardly from a lower edge thereof, the latching tab extends laterally to an exterior through the cutout for latching with the complementary connector.

10. An electrical cable connector assembly, comprising:
a metallic housing defining a receiving room therein;
a printed circuit board retained in the receiving room and including a front end with a plurality of first conductive pads protruding out of the housing for mating a complementary connector, a rear end having a plurality of second conductive pads;
a wire organizer located in the receiving room and including a body portion defining a plurality of through holes passing therethrough, and a pair of retention arms extending forward from the body portion, the pair of retention arms are spaced from each other in a vertical direction; and
a cable including a plurality of wires including a plurality of wires passing through the through holes of wire organizer, the wires are soldered to the second conductive pads of the printed circuit board respectively;
wherein the rear end of the print circuit board is sandwiched between the pair of retention arms for preventing the printed circuit board from moving relative to the wires;
wherein the rear end of printed circuit board has a middle portion with a dielectric area between adjacent second conductive pads, the pair of retention arm each defines a level inner surface abutting against the dielectric area;
wherein the pair of retention arms extend forwardly from a middle portion of the wire organizer, the middle portion is thicker than other portions of the wire organizer to ensure structure strength of the retention arms for clamping the printed circuit board firmly.

11. The electrical cable connector assembly as claimed in claim 10, further comprises a pair of latches attached to two opposite sides of the housing, each latch has a base portion retained in the housing, a pressing portion extending outwardly and rearwardly from a rear end of the base portion and disposed out of the housing, the base portion defines a cuniform latching tab bending outwardly from a lower edge thereof, the latching tab extends laterally to an exterior for latching with the complementary connector.

12. An electrical cable connector assembly comprising:
a printed circuit board defining a front mating region and a rear wire connection region in a front-to-back direction and first and second surfaces on a vertical direction perpendicular to said front-to-back direction;

a first half cover and a second half cover assembled to together and commonly defining a space accommodating said printed circuit board therein;

a plurality of cables located behind the printed circuit board, each of said cables including a set of signal wires and a grounding wire; and a wire organizer intimately positioned behind the printed circuit board, said cables extending through said wire organizer; wherein in each of said cables, the set of signal wires including outer insulators and inner conductors are located on the first surface of the rear wire connection region with the inner conductors soldered to corresponding pads thereon, and the grounding wire is located on the second surface of the rear wire connection region and soldered to a corresponding pad thereon;

wherein the wire organizer includes at least one retention arm forwardly extending beyond a rear edge of the printed circuit board and located on one of said first and second surfaces to maintain the wire organizer in position with regard to the printed circuit board;

wherein said wire organizer further includes another retention arm forwardly extending beyond the rear edge of the printed circuit board and located on the other of said first and second surfaces to cooperate with said retention arm for sandwiching said printed circuit board therebetween;

wherein an inner mold covering the rear wire connection region, the set of signal wires and the grounding wire on the rear wire connection region, and the wire organizer together.

13. The electrical cable connector assembly as claimed in claim 12, wherein the wire organizer defines a rectangular body through which said cables extend, and said rectangular body is essentially offset from the printed circuit board in the vertical direction.

* * * * *